United States Patent [19]

Gaku et al.

[11] 3,987,230

[45] Oct. 19, 1976

[54] LAMINATES AND PROCESS FOR PRODUCTION THEREOF

[75] Inventors: Morio Gaku; Kazuhiro Suzuki; Kazuyuki Nakamichi, all of Tokyo, Japan

[73] Assignee: Mitsubishi Gas Chemical Company, Inc., Tokyo, Japan

[22] Filed: Mar. 10, 1975

[21] Appl. No.: 556,917

[30] Foreign Application Priority Data

Mar. 13, 1974 Japan............................ 48-28932

[52] U.S. Cl................................ 428/236; 156/330; 156/331; 428/251; 428/284; 428/285; 428/287; 428/432; 428/457; 428/901
[51] Int. Cl.²........................................... H05K 1/00
[58] Field of Search........... 156/310, 313, 330, 331; 428/228, 236, 457, 246, 251, 287, 285, 901, 284, 286, 432

[56] References Cited

UNITED STATES PATENTS

| 3,318,750 | 5/1967 | Aitken et al. | 156/331 |
| 3,658,623 | 9/1972 | Grigat et al. | 156/331 |
| 3,718,587 | 2/1973 | Bhokuni et al. | 156/331 |
| 3,897,588 | 7/1975 | Nohtomi | 428/901 |

*Primary Examiner*—James J. Bell
*Attorney, Agent, or Firm*—Brooks Haidt Haffner & Delahunty

[57] ABSTRACT

A laminate comprising at least one inorganic or organic fiber nonwoven fabric impregnated with a cyanic acid ester resin composition, at least one glass fabric impregnated with an epoxy resin composition, and at least one of the outermost layers being the glass fabric impregnated with an epoxy resin composition.

18 Claims, No Drawings

1

LAMINATES AND PROCESS FOR PRODUCTION THEREOF

BACKGROUND OF THE INVENTION

1. Field of the Invention

This invention relates to a laminate and further to a process for producing the laminate. More, particularly, it relates to a laminate having superior properties, for instance, punchability, thermal stability, dimensional stability, mechanical properties, and electrical properties, which comprises at least one inorganic or organic fiber nonwoven fabric impregnated with cyanic acid ester resin composition and at least one glass fabric impregnated with epoxy resin composition, and at least one outermost layer of the laminate being a glass fabric.

2. Description of the Prior Art

Heretofore, there have been known laminates composed of at least one nonwoven fabric and at least one glass fabric as the base materials and the outermost layer being a glass fabric. For example, there may be mentioned a glass fabric-glass paper laminate, a glass fabric-synthetic fiber nonwoven fabric laminate, a glass fabric-glass mat laminate and a glass fiber fabric-paper laminate. In these conventional laminates there is usually used epoxy resin, phenolic resin, or the like as a resin with which the base material is impregnated, for the purpose of improving punchability and drilling properties. However, the laminates obtained by using prepregs impregnated with such resin have a very large coefficient of thermal expansion in the direction of thickness. In a printed circuit board with plated through-holes made of these laminates, thermal expansion of the board causes a strong stress which is applied to the deposited copper layer of plated through-holes at high temperature and thereby a crack is formed in the metal of the plated through-holes and reliability of the printed circuit board is lowered to a great extent. In addition, thermal expansion coefficients of two base materials in such type of laminates are usually largely different. Since there occurs exfoliation between the glass fabric layer and the nonwoven fabric layer when a plated printed circuit board expands at high temperature, the metal layers of through-holes are broken at the interface between the glass fabric layer and nonwoven fabric layer in which the stress is concentrated. Therefore, these types of laminates are not usually suitable for printed circuit boards with plated through-holes.

Indeed it is possible to lower the thermal expansion coefficient of the laminate by using a high heat resistant type resin as an impregnating resin, but still it is not possible to avoid exfoliation between the base materials and concentration of stress to the metal layer of plated through-holes at the interface portion between the glass fabric layer and nonwoven fabric layer. Further the laminates produced with a high heat-resistant type resin have poor punchability.

SUMMARY OF THE INVENTION

According to the present invention, there is provided a laminate which comprises at least one inorganic or organic fiber nonwoven fabric impregnated with a cyanic acid ester resin composition, at least one glass fabric impregnated with an epoxy resin composition, and at least one of the outermost layers being the glass fabric impregnated with an epoxy resin composition.

According to another aspect of the present invention, there is provided a process for producing the laminate which comprises impregnating a glass fabric with an epoxy resin composition followed by drying to form a prepreg, impregnating an inorganic or organic fiber nonwoven fabric with a cyanic acid ester resin composition followed by drying to form a prepreg, and laminating the prepregs, and at least one of the outermost layers being the glass fabric.

An object of the present invention is to provide a laminate having an excellent punchability at room temperature and having very low thermal expansion coefficient in the direction of thickness of the laminate.

Another object of the present invention is to provide a laminate suitable for producing a printed circuit board having high reliability of plated through-holes.

Further object of the present invention is to provide a laminate suitable for producing a printed circuit board by conventional additive methods.

DESCRIPTION OF THE PREFERRED EMBODIMENT

The cyanic acid ester resin composition used in the present invention impregnated into the inorganic or organic fiber nonwoven fabric is a mixture of a curing catalyst, a cyanic acid ester (infra.) and/or its prepolymer, and if desired additionally a resin, such as epoxy resin, bismaleimide resin, prepolymer of bismaleimide and amine, phenolic resin, polyester resin, melamine resin and the like.

The cyanic acid ester used in the present invention is a compound having at least two cyanato groups in one molecule of the formula $$R\!\!+\!\!O\!\!-\!\!C\!\!\equiv\!\!N)_n$$

where R is a member selected from the class of residue containing an aromatic nucleus derived from benzene, biphenyl or naphthalene;

a residue containing an aromatic nucleus derived from two or more benzene nuclei bonded with a bridging member selected from the class of

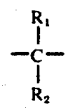

where $R_1$ and $R_2$ are, similar or dissimilar, selected from the class of hydrogen and alkyl having 1 – 4 carbon atoms, $-\text{O}-$, $-\text{CH}_2\text{OCH}_2-$, $-\text{S}-$,

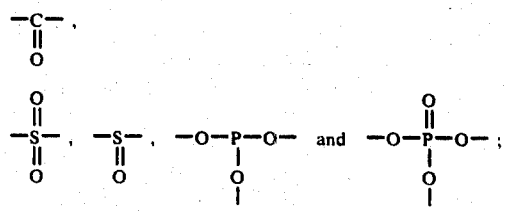

a residue containing an aromatic nucleus obtained by removing a phenolic hydroxy group from a novolak or resol type phenolic resin structure; and a residue containing an aromatic nucleus obtained by removing a terminal hydroxy group from a polycarbonate oligomer, and the aromatic nucleus may have at least one substitute selected from the class of alkyl having 1 – 4 carbon atoms, alkoxy having 1 – 4 carbon atoms, chloro and bromo, n is an integer of 2 – 5, and the cyanato group is directly bonded to an aromatic nucleus.

The prepolymer of cyanic acid ester is preferably the trimer, i.e., a polymer having a triazine ring formed by trimerization of the cyanato group of a cyanic acid ester, the prepolymer of cyanic acid ester preferably having a molecular weight of from 400 to 6000.

The prepolymer of cyanic acid ester may be produced by polymerizing the above-mentioned cyanic acid ester in the presence of an acid such as mineral acids, Lewis acids and the like, bases such as sodium hydroxide, sodium alcoholate, tertiary amines and the like, salts such as sodium carbonate, lithium chloride and the like, or phosphorus compounds such as tributyl phosphine and the like, as a catalyst.

Cyanic acid esters used in the present invention includes dicyanato benzene,
4,4'-dicyanato biphenyl,
1,5-dicyanato naphthanene,
bis(4-cyanato phenyl)methane,
2,2-bis(4-cyanato phenyl)propane,
2,2-bis(3,5-dichloro-4-cyanato phenyl)propane,
2,2-bis(3,5-dibromo-4-cyanato phenyl)propane,
bis(4-cyanato phenyl)ether,
bis(4-cyanato phenyl)thioether,
bis(4-cyanato phenyl)sulfone,
tris(4-cyanato phenyl)phosphite,
tris(4-cyanato phenyl)phosphate;

a cyanic acid ester derived from a Novolak type phenolic resin having a structural unit of the formula

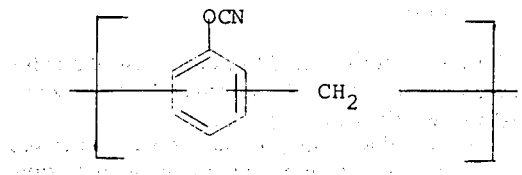

and a cyanic acid ester derived from a polycarbonate oligomer having the formula

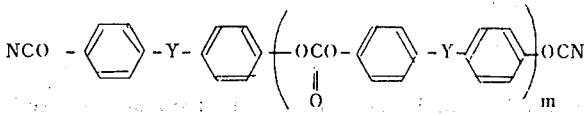

where Y is selected from the above mentioned bridging members and m is an integer of 1 – 10.

The curing catalyst used in the present invention is that for the cyanic acid ester and/or its prepolymer. Representative curing catalysts are metal salts of fatty acids, preferably, long chain fatty acids such as zinc caprylate, lead stearate, tin oleate and the like, phenols such as catechol and the like and amines such as triethylenediamine, imidazoles and the like. One or more of the curing catalysts may be used. Among the curing catalysts, imidazoles are most preferable since handling of imidazoles is easy and the varnish containing the catalyst has an excellent storing stability.

The imidazoles include:
2-methyl imidazole,
2-isopropyl imidazole,
2-undecyl imidazole,
2-heptadecyl imidazole,
2-phenyl imidazole,
2-ethyl-4-methyl imidazole,
1-benzyl-2-methyl imidazole,
1-propyl-2-methyl imidazole,
1-cyanoethyl-2-methyl imidazole,
1-cyanoethyl-2-ethyl-4-methyl imidazole,
1-cyanoethyl-2-undecyl imidazole,
1-cyanoethyl-2-phenyl imidazole,
1-aminopropyl-2-phenyl imidazole,
1-guanaminoethyl-2-methyl imidazole,
and acid addition salts of these imidazoles with trimellitic acid.

According to the present invention, the above mentioned cyanic acid ester and its prepolymer are not only used alone, but also may be used in combination with other resins for modification. It is preferable to use in combination with another resin for modification. Such resins may be epoxy resin, bismaleimide resin, a prepolymer of bismaleimide and amine, phenolic resin, polyester resin and melamine resin. In general, these resins are incorporated in an amount of not higher than 40% by weight, preferably, not higher than 30% by weight, more preferably, 2 – 10% by weight based on the total resin in the cyanic acid ester resin composition. The amount of the cyanic acid ester resin composition impregnated into the nonwoven fabric is usually 40 – 80% by weight based on the prepreg.

The epoxy resin composition impregnated into the glass fabrics may be an epoxy resin combined with its curing agent, and if necessary, with other resin for modification.

Representative epoxy resins are bisphenol A type epoxy resin, halogenated bisphenol A type epoxy resin, novolak type epoxy resin, alicyclic epoxy resin, and compounds having two or more epoxy groups in one molecule; these epoxy resins are conventional resin.

The curing agent may be a conventional one for curing epoxy resins, for example, amines such as dicyandiamide, diaminodiphenyl methane, diaminodiphenyl sulfone, imidazole and the like, and acid anhydride such as phthalic acid anhydride and the like.

The above mentioned epoxy resins may be used in combination. The other resin for modification may be used in combination with the epoxy resin. Such resin for modification may be a phenolic resin, cyanic acid ester resin and bismaleimide resin and silicon resin. Such resin is preferably mixed in an amount of not more than 30% by weight base on the total resin. Further, the amount of epoxy resin composition impregnated into the glass fabric is usually 35 – 60% by weight base on the prepreg.

The cyanic acid ester resin composition and epoxy resin composition may be disolved in a solvent such as acetone, methyl ethyl ketone dimethyl formamide, ethylene glycol monomethyl ether (Methyl Cellosolve) and the like adjusted to an appropriate viscosity for coating or impregnating to obtain a varnish, and then coated on or impregnated into the nonwoven fabric or glass fiber fabric with the varnish, dried at temperatures lower than 170° C to produce a prepreg, and laminated at 20 – 50 Kg./cm² at 150° – 200° C for 1 – 3 hours. It is effective and preferable to post-cure the laminate thus shaped at 140° – 250° C for less than 3 hours to cure the resins completely and remove a shaping strain.

The nonwoven fabric used in the present invention includes glass papers, glass mats, glass-cellulose papers, cellulosic papers, synthetic fiber nonwoven fabric such as polyethylene terephthalate fiber (Tetrone) nonwoven fabric, and ceramic paper, preferably with glass paper.

The laminate according to the present invention may be used for producing a printed circuit board. For example, a metal foil may be placed on one or both outermost layers of piled up prepregs and the formed assembly pressed under heating. The metal foil may be copper foil, copper-aluminum composite foil, aluminum foil and nickel foil.

The cured cyanic acid ester resin composition has high heat resistance and is not fragile, but has flexibility and has excellent mechanical and electrical properties. Further the cyanic acid ester resin used in this invention has an excellent adhesion with cellulose fiber and glass fiber as base materials and shows a good affinity to epoxy resin. Therefore, the laminates according to the present invention shows a very low thermal expansion coefficient in the direction of thickness of the laminate and said laminate is excellent in mechanical, electrical properties and workability and further a printed circuit board made of the laminate is free from damage at plated through-holes.

The following examples are given for illustrating the present invention, but not for restriction thereof.

EXAMPLE 1

Base materials glass fiber fabric:
  glass fiber fabric 9018G (supplied by Nitto Boseki)
Nonwoven fabric:
  "GLASPER" (trade name, glass paper, supplied by Honshu Paper Co., LTD.), 50g./m$^2$, 0.25mm. thick.

In methyl ethyl ketone was dissolved a resin composition composed of 100 parts by weight of epoxy resin ("Epikote 1001", trade name, epoxy equivalent of 450 – 500, supplied by Shell Chemical Co.), 7 parts by weight of dicyandiamide, and 0.5 parts by weight of 2-ethyl-4-methyl imidazole as a catalyst to produce a resin solution containing 40% resin solid matter. The resin solution was impregnated into the glass fiber fabric and dried at 140° C for 5 minutes to form a prepreg (1).

On the other hand, in methyl ethyl ketone was dissolved a resin composition composed of 95 parts by weight of a prepolymer derived from 2,2-bis(4-cyanatophenyl)propane as a cyanic acid ester (a 70% solution varnish in methyl ethyl ketone) ("KU 6573", trade name, supplied by Bayer AG), 5 parts by weight of epoxy resin (the same as above), 0.2 parts by weight of zinc caprylate (8% zinc) as a catalyst, 0.1 parts by weight of catechol and 0.02 parts by weight of triethylenediamine to produce a resin solution containing 40% resin solid matter. The resin solution was impregnated into the above mentioned glass paper and dried at 140° C for 5 minutes to produce a prepreg (2).

Four sheets of the resulting prepreg (2) were piled up, and the prepregs (1) were placed on the outermost portions, and further, a copper foil was placed on the outermost portions of the prepregs (1) followed by laminating at 180° C at 30Kg./cm$^2$, for 2 hours to obtain a laminate of 1.6mm. thickness. Physical properties of the resulting laminate are as shown in Table 1, (I) (infra.)

EXAMPLE 2

Repeating the procedure in Example 1 above except that a resin composition to be impregnated into the glass paper composed of KU 6573 (as used in Example 1) 100 parts by weight, zinc caprylate (15% zinc) 0.1 part by weight, catechol 0.1 part by weight, 2-ethyl-4-methylimidazole 0.1 part by weight dissolved in methyl ethyl ketone to form a resin solution (40% resin solid matter) was used in place of the resin solution in Example 1, there was obtained a copper-clad laminate. Physical properties of this laminate are as shown in Table 1, (II) (infra.)

EXAMPLE 3

In methyl ethyl ketone was dissolved a resin composition composed of a brominated epoxy resin ("Epikote 1045", trade name, epoxy equivalent 440–520, Br content 20%, supplied by Shell Chemical) 80 parts by weight, "KU 6573" as used in Example 1 20 parts by weight, and 2-ethyl-4-methyl imidazole 0.2 parts by weight to obtain a resin solution containing 40% resin solid matter. The resulting resin solution was impregnated into a glass fabric as used in Example 1 and dried in a manner similar to Example 1 to produce prepreg (3).

In methyl ethyl ketone was dissolved "KU 6573" as used in Example 1 80 parts by weight, diglycidyl ether of tetrabromobisphenol A (epoxy equivalent 340 ± 15, Br content 44 – 48%) 20 parts by weight, zinc caprylate (15% zinc) 0.1 part by weight, catechol 0.1 part by weight and 2-ethyl-4-methyl imidazole 0.02 parts by weight to form a resin solution having the same resin solid matter content as that in Example 1. The resulting resin solution was impregnated into a glass paper as used in Example 1 and dried in a similar manner to Example 1 to produce prepreg (4).

The resulting prepregs (3) and (4) were used together with copper foils and laminated in a manner similar to Example 1 to obtain a laminate having copper covering. Physical properties of the resulting laminate are as shown in Table 1, (III) (infra.)

EXAMPLE 4

Base materials glass fiber fabric:
  glass fiber fabric 9018G (supplied by Nitto Boseki)
Nonwoven fabric:
  "GLASPER" (trade name, glass paper, supplied by Honshu Paper Co. LTD.), 50g./m$^2$, 0.25mm. thick.

In methyl ethyl ketone was dissolved a resin composition composed of 100 parts by weight of epoxy resin ("Epikote 1001", trade name, epoxy equivalent of 450 – 500, supplied by Shell Chemical Co.), 7 parts by weight of dicyandiamide, and 0.5 parts by weight of 2-ethyl-4-methyl imidazole as a catalyst to produce a resin solution containing 40% resin solid matter. The resin solution was impregnated into the glass fiber fabric and dried at 140° C for 5 minutes to form a prepreg (1).

On the other hand, in methyl ethyl ketone was dissolved a resin composition composed of 95 parts by weight of a prepolymer derived from 2,2-bis(4-cyanatophenyl)propane as a cyanic acid ester (a 70% solution varnish in methyl ethyl ketone) ("KU 6573" trade name, supplied by Bayer AG), 5 parts by weight of epoxy resin (the same as above), 0.2 parts by weight of zinc caprylate (8% zinc) as a catalyst 0.1 part by weight of catechol and 0.02 parts by weight of triethylenediamine to produce a resin solution containing 40% resin solid matter. The resin solution was impregnated into the above mentioned glass paper and dried at 140° C for 5 minutes to produce a prepreg (2).

Four sheets of the resulting prepreg (2) were piled up, and the prepregs (1) were placed on the outermost portions, followed by laminating at 180° C at 30 Kg./cm$^2$, for 2 hours to obtain a laminate of 1.6mm. thickness.

The resulting laminate showed excellent punchability.

COMPARATIVE EXAMPLE 1

The procedure of Example 1 was repeated except that glass fabric and glass paper were impregnated with the cyanic acid ester resin composition as used in Example 1 to prepare prepregs and there was obtained a copper-clad laminate. Physical properties of the resulting laminate are shown in Table 1, (IV) (infra.). As are clear from the table, the resulting laminate has a large shearing strength, a poor punchability and electrical properties.

COMPARATIVE EXAMPLE 2

Repeating the procedure of Example 1 except that glass fiber fabric and glass paper were impregnated with the epoxy resin composition as used in Example 1, there was obtained a copper-clad laminate. Physical properties of the resulting laminate are as shown in Table 1, (V). (infra.)

COMPARATIVE EXAMPLE 3

(1) As base material, only glass fabric was used and the epoxy resin composition as in Example 1 was used to form a prepreg. Nine sheets of the resulting prepreg were laminated together with copper foil to produce a copper-clad laminate. Physical properties of the resulting laminate are shown in Table 1, (VI) (infra.)

(2) Repeating the procedure of (1) above except that the cyanic acid ester resin composition as used in Example 1 was used in place of the epoxy resin composition, there was obtained a copper-clad laminate. Physical properties of the resulting laminate are shown in Table 1, (VII) (infra.) As are clear from the table, the resulting laminate has a large shearing strength and a poor punchability.

We claim:

1. A process for producing a laminate having a plurality of layers comprising at least one inorganic fiber nonwoven fabric and at least one glass fabric, and at least one of the outermost layers being the glass fabric, which process comprises:
   1. impregnating the inorganic or organic fiber nonwoven fabric with a cyanic acid ester resin composition comprising a cyanic acid ester resin derived from a compound having at least two cyanato groups in a molecule and a curing catalyst followed by drying to form a prepreg,
   2. impregnating the glass fabric with an epoxy resin composition comprising an epoxy compound having at least two epoxy groups in a molecule and a curing agent followed by drying to form a prepreg, and
   3. laminating the prepregs as obtained in steps (1) and (2) by heating under pressure.

2. A process according to claim 1 in which the cyanic acid ester resin composition contains at least one additional resin.

3. A process according to claim 1 in which the epoxy resin composition contains at least one additional resin.

4. A process according to claim 1 in which the epoxy compound is selected from a class of bisphenol A type epoxy resin, halogenated bisphenol A type epoxy resin and novolak type epoxy resin.

5. A process according to claim 1 in which the curing agent for epoxy compound is selected from a class of dicyandiamide, diaminodiphenyl methane, and diaminodiphenyl sulfone.

6. A process according to claim 1 in which the compound having at least two cyanato groups is a cyanic acid ester of the formula

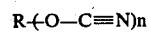
$$R \text{\textendash}(O\text{\textemdash}C\equiv N)_n$$

where
R is a member selected from the class of a residue containing an aromatic nucleus derived from benzene, biphenyl or naphthalene;
a residue containing an aromatic nucleus derived from two or more benzene nuclei bonded with a bridging member selected from the class of

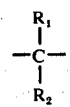

$$\begin{array}{c} R_1 \\ | \\ -C- \\ | \\ R_2 \end{array}$$

where

TABLE 1

|  |  | I | II | III | IV | V | VI | VII |
|---|---|---|---|---|---|---|---|---|
| Shearing resistance | Kg/cm$^2$ | 9.4 | 9.5 | 9.2 | 12.5 | 8.3 | 15.0 | 17.0 |
| Thermal expansion in the direction of thickness of the plate at 250° C | mm/mm | 0.027 | 0.026 | 0.029 | 0.023 | 0.071 | 0.039 | 0.017 |
| Flexural strength (JIS C-6481) | L | 37 | 37 | 35 | 38 | 36 | 56 | 50 |
|  | C (Kg/cm$^2$) | 30 | 32 | 30 | 30 | 29 | 51 | 45 |
| Punchability (ASTM D-617) | at room temperature | very good | very good | very good | Poor | Good | None | None |
| Insulation resistance (JIS C-6481) | D-2/100 Ω | 1×10$^{11}$ | 1×10$^{11}$ | 5×10$^{11}$ | 1×10$^{12}$ | 5×10$^{10}$ | 5×10$^{10}$ | 1×10$^{12}$ |
| Dielectric Constant (1MH$_z$) | — | 3.6 | 3.5 | 3.7 | 3.4 | 4.1 | 4.8 | 4.2 |
| Dielectric loss tangent (1MH$_z$) | — | 0.0062 | 0.0054 | 0.0059 | 0.0053 | 0.0230 | 0.0170 | 0.0051 |

$R_1$ and $R_2$ are, similar or dissimilar, selected from the class of hydrogen and alkyl having 1 – 4 carbon atoms, — O —, — CH$_2$OCH$_2$—, — S —, $$-\overset{\overset{\displaystyle -}{\|}}{\underset{\displaystyle O}{C}}-,$$

$$-\overset{\overset{\displaystyle O}{\|}}{\underset{\underset{\displaystyle O}{\|}}{S}}-,\ -\overset{\overset{\displaystyle O}{\|}}{\underset{\underset{\displaystyle O}{\|}}{S}}-,\ -O-\overset{}{\underset{\underset{\displaystyle O}{|}}{P}}-O-\ \text{and}\ -O-\overset{\overset{\displaystyle O}{\|}}{\underset{\underset{\displaystyle O}{|}}{P}}-O-\ ;$$

a residue containing an aromatic nucleus obtained by removing a phenolic hydroxy group from a novolak or resol type phenolic resin structure; and a residue containing an aromatic nucleus obtained by removing a terminal hydroxy group from a polycarbonate oligomer, and the aromatic nucleus may have at least one substitute selected from the class of alkyl having 1 – 4 carbon atoms, alkoxy having 1 – 4 carbon atoms, chloro and bromo, $n$ is an integer of 2 – 5, and the cyanato group is directly bonded to an aromatic nucleus.

7. A process according to claim 6 in which the cyanic acid ester is selected from the class of
dicyanato benzene,
4,4′-dicyanato biphenyl,
1,5-dicyanato naphthalene,
bis(4-cyanato phenyl)methane,
2,2-bis(4-cyanato phenyl)propane,
2,2-bis(3,5-dichloro-4-cyanato phenyl)propane,
2,2-bis(3,5-dibromo-4-cyanato phenyl)propane,
bis(4-cyanato phenyl)ether,
bis(4-cyanato phenyl)thioether,
bis(4-cyanato phenyl)sulfone,
tris(4-cyanato phenyl)phosphite,
tris(4-cyanato phenyl)phosphate;

a cyanic acid ester derived from a Novolak or resol type phenolic resin having a structural unit of the formula $$\left[\underset{\text{OCN}}{\underset{|}{\bigcirc}}-CH_2\right]\ ;$$

and a cyanic acid ester derived from a polycarbonate oligomer having the formula $$NCO-\bigcirc-Y-\bigcirc-\left[OCO-\bigcirc-Y-\bigcirc\right]_m OCN$$

where

Y is selected from the above mentioned bridging members and $m$ is an integer of 1 – 10.

8. A process according to claim 1 in which the cyanic acid ester resin composition contains a prepolymer of a cyanic acid ester.

9. A process according to claim 1 in which the curing catalyst for the cyanic acid ester resin is selected from the class of metal salts of fatty acids, amines and phenols.

10. A process according to claim 9 in which the curing catalyst is zinc caprylate, lead stearate, tin oleate, triethylenediamine, or catechol.

11. A process according to claim 9 in which the curing catalyst is an imidazole selected from the class of
2-methyl imidazole,
2-isopropyl imidazole,
2-undecyl imidazole,
2-heptadecyl imidazole,
2-phenyl imidazole,
2-ethyl-4-methyl imidazole,
1-benzyl-2-methyl imidazole,
1-propyl-2-methyl imidazole,
1-cyanoethyl-2-methyl imidazole,
1-cyanoethyl-2-ethyl-4-methyl imidazole,
1-cyanoethyl-2-undecyl imidazole,
1-cyanoethyl-2-phenyl imidazole,
1-aminopropyl-2-phenyl imidazole,
1-guanaminoethyl-2-methyl imidazole,
and acid addition salts of these imidazoles with trimellitic acid.

12. A process according to claim 1 in which the amount of the cyanic acid ester resin is at least 60% by weight based on the total resin in the cyanic acid ester resin composition.

13. A process according to claim 1 in which the amount of the epoxy compound is at least 70% by weight based on the total resin in the epoxy resin composition.

14. A process according to claim 1 in which a metal foil is placed on at least one of the outermost layers upon laminating.

15. A laminate having a plurality of layers which comprises at least one inorganic or organic fiber nonwoven fabric impregnated with a cyanic acid ester resin composition, at least one glass fabric impregnated with an epoxy resin composition, and at least one of the outermost layers being the glass fabric impregnated with an epoxy resin composition.

16. A laminate according to claim 15 in which a metal layer is present on the outermost layer.

17. A laminate according to claim 15 in which at least two glass fiber fabrics are employed and both outermost layers of the laminate are made of the glass fiber fabrics.

18. A laminate according to claim 17 in which at least one of the outermost layers has a metal layer overlying the outermost layer.

* * * * *